United States Patent
Nonis et al.

(10) Patent No.: US 9,985,639 B2
(45) Date of Patent: May 29, 2018

(54) DETECTION AND MITIGATION OF NON-LINEARITY OF PHASE INTERPOLATOR

(71) Applicant: Infineon Technologies AG, Neubiberg (DE)

(72) Inventors: Roberto Nonis, Warmbad-Villach-Austria (AT); Peter Thurner, Weissensee (AT); Thomas Santa, Seeboden (AT)

(73) Assignee: Infineon Technologies AG, Neubiberg (DE)

( * ) Notice: Subject to any disclaimer, the term of this patent is extended or adjusted under 35 U.S.C. 154(b) by 144 days.

(21) Appl. No.: 14/988,745

(22) Filed: Jan. 5, 2016

(65) Prior Publication Data
US 2017/0194976 A1    Jul. 6, 2017

(51) Int. Cl.
| | | |
|---|---|---|
| H03L 7/00 | (2006.01) |
| H03L 7/24 | (2006.01) |
| H03L 7/08 | (2006.01) |
| H04L 7/00 | (2006.01) |
| H03L 7/093 | (2006.01) |
| H03L 1/02 | (2006.01) |
| H03L 7/099 | (2006.01) |
| H03L 7/10 | (2006.01) |
| H03K 9/08 | (2006.01) |
| H04L 7/033 | (2006.01) |

(52) U.S. Cl.
CPC .................. *H03L 7/24* (2013.01); *H03K 9/08* (2013.01); *H03L 1/022* (2013.01); *H03L 7/08* (2013.01); *H03L 7/093* (2013.01); *H03L 7/099* (2013.01); *H03L 7/10* (2013.01); *H04L 7/00* (2013.01); *H04L 7/033* (2013.01)

(58) Field of Classification Search
CPC ... H03L 2207/50; H03L 7/091; H03L 7/0991; H03L 7/1806; H03L 7/1974; H03L 7/0992; H03L 7/1976; H03L 7/085; H03L 7/093; H03L 1/022; H03L 7/08; H03L 7/099; H03L 7/10; H03L 7/1803; H03L 7/24; G04F 10/005; H03M 1/0639; H04B 1/04; H04B 1/0483; H03B 21/00; H03B 21/02; H03B 19/00; H03B 19/14; H03K 5/00006; H03K 5/13; H03K 5/1565; H03K 9/08; H04L 7/00; H04L 7/033
USPC .......... 455/226.3, 67.13; 375/371, 294, 215, 375/326, 376, 342, 355; 331/1 A, 17; 341/69

See application file for complete search history.

(56) References Cited

U.S. PATENT DOCUMENTS

| | | | | |
|---|---|---|---|---|
| 8,934,594 | B1* | 1/2015 | Malhotra | ............ H04L 27/2338 375/355 |
| 2006/0093081 | A1* | 5/2006 | Ibrahim | .................... H04L 7/08 375/354 |

* cited by examiner

*Primary Examiner* — Arnold Kinkead
(74) *Attorney, Agent, or Firm* — Shumaker & Sieffert, P.A.

(57) ABSTRACT

Representative implementations of devices and techniques provide non-linearity detection and mitigation for a phase interpolator of a controlled oscillator circuit, such as a PLL. A bit stream output of a phase detector of the oscillator circuit is segmented according to multiple phase positions of the phase interpolator, forming a bit stream for each of the multiple phase positions. Each bit stream of each phase position is analyzed, and phase position errors may be detected and mitigated based on the contents of the bit streams.

25 Claims, 8 Drawing Sheets

(A)

(B)

DETECTION AND MITIGATION OF NON-LINEARITY OF PHASE INTERPOLATOR

BACKGROUND

Phase-locked loop (PLL) devices are control systems that generate signals having a fixed relationship to the phase of a reference signal. Typically, a phase-locked loop device generates a desired signal in response to both the frequency and the phase of the reference signal as well as a control signal. Often this includes raising or lowering the frequency of a frequency generator, such as a digitally controlled oscillator (DCO), or the like, until a true or modified form (a fraction, for example) of the oscillator output signal is matched with the reference signal in both frequency and phase. Phase-locked loops are widely used in radio, telecommunications, computers, and other electronic applications.

Controlled oscillators may experience jitter, or variations in the timing of the rising and/or falling edges of the periodic signal. Accumulated jitter can cause in-band phase noise, and like negative effects. Oscillators controlled via a PLL may experience jitter when operating the PLL in a fractional mode. For example, the PLL may use a fractional feedback divider, allowing the generation of output frequencies that are fractional multiples of the reference frequency. Over-threshold jitter or phase noise can make some PLLs operating in fractional mode less desirable for higher-accuracy uses, such as with wireless applications, for example.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
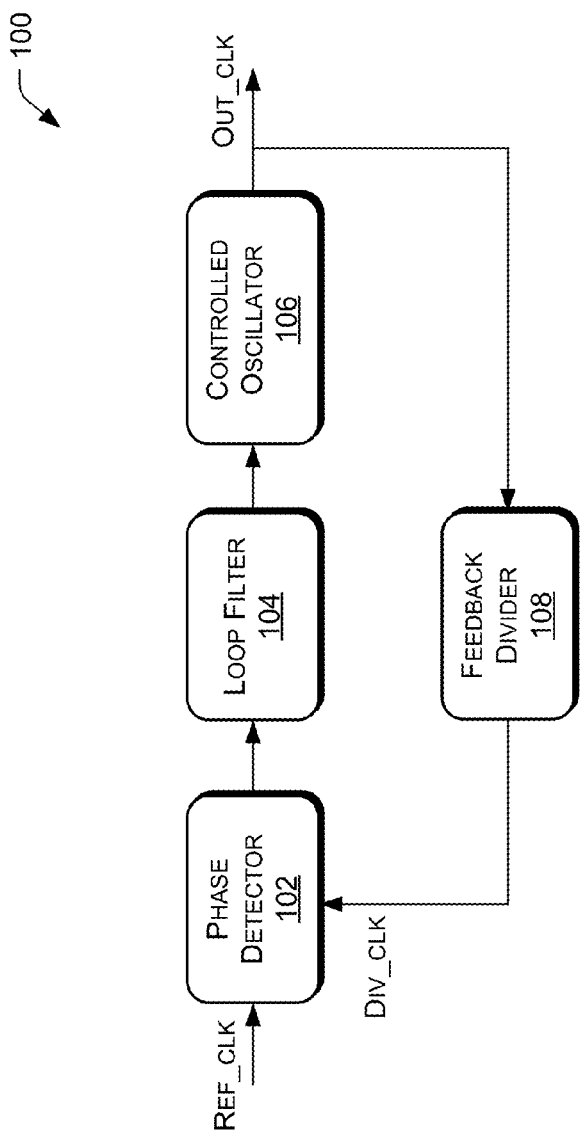
FIG. 1 is a block diagram of an example PLL circuit, according to an implementation.

Representative implementations of devices and techniques provide non-linearity detection and mitigation (i.e., linearization) for a phase interpolator (PI) of a feedback divider of a controlled oscillator circuit, such as a PLL for example, having a digitally controlled oscillator (DCO), a voltage controlled oscillator (VCO), or the like. Reducing the non-linearity of the PI reduces jitter and phase noise of the controlled oscillator circuit when the controlled oscillator circuit is operating in a fractional mode.

In an implementation, the PI includes multiple phase positions to assist in providing fractional division to the oscillator circuit (e.g., PLL). In the implementation, the oscillator circuit includes a digital bang-bang phase detector, which produces a 1-bit output stream based on a comparison of a reference clock to a divided clock signal. The 1-bit output stream of the phase detector is segmented according to the multiple phase positions of the PI, forming a 1-bit stream for each of the multiple phase positions.

In an implementation, each 1-bit stream of each phase position is analyzed, and phase position errors of the PI may be detected and mitigated based on the contents of the bit streams. For instance, the proportion of accumulated 1 bits to accumulated 0 bits in the bit streams can be used to determine whether a phase position error exists, whether it is a leading or lagging error, and can be interpreted to show a magnitude of the phase position error. Mitigating the phase position errors can include adjusting a PI phase position from an actual phase position (e.g., the position in error) to an ideal phase position (e.g., the intended position). In the implementation, mitigating phase position errors reduces jitter and phase noise of the oscillator circuit output signal.

In some implementations, the detection and mitigation of phase position errors is performed during a training sequence or during startup of the PI and the oscillator circuit. In such cases, a linearization (i.e., mitigation) coefficient may be determined and stored for mitigating the non-linearity of the PI during steady-state operation. In these implementations, the error detection/mitigation routines and/or components need not be operational once the linearization coefficient is determined. Alternately, the error detection/mitigation routines may be periodically run to tune the oscillator circuit, as desired.

In other implementations, the detection and mitigation of phase position errors is performed automatically and continuously during steady-state operation of the PI and the oscillator circuit. In such cases, the error detection/mitigation routines and/or components dynamically determine phase position errors of the PI during steady-state operation and adjust erroneous phase positions on the fly.

Various implementations and arrangements are discussed with reference to electrical and electronics components and circuits. While specific components are mentioned, this is not intended to be limiting, and is for ease of discussion and illustrative convenience. The techniques and devices discussed with reference to a PLL arrangement and/or a digitally controlled oscillator (DCO) circuit are applicable to various types or designs of PLL arrangements and oscillator circuits, as well as related circuits (e.g., integrated circuits, analog circuits, digital circuits, mixed circuits, etc.), groups of components, structures, and the like. Further, the oscillators discussed and illustrated need not be applied solely to PLLs, and may be employed with various other circuits or systems that use a generated periodic or controlled clock signal.

Implementations are explained in more detail below using a plurality of examples. Although various implementations and examples are discussed here and below, further implementations and examples may be possible by combining the features and elements of individual implementations and examples.

Example PLL

FIG. 1 is a block diagram of an example PLL arrangement ("PLL") 100, according to an implementation. The PLL 100 represents an example environment whereby the techniques and devices discussed herein may be applied. The techniques, components, and devices described herein with respect to the PLL 100 are not limited to the illustration in FIG. 1, and may be applied to other designs, types, and constructions of PLLs, oscillator circuits, or other similar structures without departing from the scope of the disclosure. For the purposes of this disclosure, the use of the term "oscillator circuit" refers to a control circuit (such as a PLL, for example) that includes a controlled oscillator. Further, the use of the term "PLL" is intended to include other "oscillator circuits," unless otherwise stated. In some cases, alternative components may be used to implement the techniques described herein.

In an example implementation, as shown in FIG. 1, the PLL 100 may include a phase detector 102, a loop filter 104, a controlled oscillator (CO) 106, and a feedback divider 108. In general terms, the CO 106 may be arranged to produce an output signal (out_clk) having a frequency proportional to a value of a digital control word. The digital control word is the result of a reference clock signal (ref_clk) and a modified clock signal (div_clk) based on the output out_clk of the CO 106, and is used to adjust or "lock" the frequency of the CO 106 to a desired output frequency. The output out_clk of the CO 106 is also the output of the PLL 100.

In various implementations, the CO 106 may comprise one of various controlled oscillators, such as a digitally controlled oscillator (DCO), a digitally controlled ring oscillator (DCRO), a voltage controlled oscillator (VCO) or the like.

In an implementation, the feedback divider 108 is arranged to provide the modified clock signal div_clk based on the output signal out_clk from the CO 106 and a divider value. For example, as shown in FIG. 1, the output out_clk of the CO 106 is fed back through the feedback divider 108. The feedback divider 108 divides the frequency of the output signal out_clk by the divider value to produce the modified clock signal div_clk.

In the example, the reference clock signal ref_clk and the modified clock signal div_clk are received by the phase detector 102. In an implementation, the phase detector 102 senses a phase difference between the reference clock signal ref_clk and the modified clock signal div_clk and outputs a signal that is a representation of the phase difference detected. In one implementation, the phase detector 102 may be arranged to detect whether a phase of the reference clock signal ref_clk leads or lags a phase of the modified clock signal div_clk.

The loop filter 104 is arranged to form the digital control word based on the representation of the phase difference from the phase detector 102. In an implementation, the loop filter 104 comprises a digital loop filter. The digital control word may contain the phase difference information from the output of the phase detector 102. Accordingly, the digital control word prompts the CO 106 to increase its output frequency or decrease its output frequency based on the phase difference indicated by the digital control word.

For example, if the reference clock signal ref_clk is leading the output clock signal out_clk or modified clock signal div_clk, the digital control word may prompt the CO 106 to increase its output frequency. Conversely, if the reference clock signal ref_clk is lagging the output clock signal out_clk or modified clock signal div_clk, the digital control word may prompt the CO 106 to decrease its output frequency. In alternate implementations, this may occur in a different manner for the leading and lagging conditions. Further, in some implementations, the loop filter 104 may comprise an analog filter, arranged to generate a control signal to prompt the CO 106 to increase or decrease its frequency in a similar manner.

In alternate implementations, variations of a PLL 100 are also within the scope of the disclosure. The variations may have fewer elements than illustrated in the example shown in FIG. 1, or they may have more or alternate elements than those shown.

Figure 2:
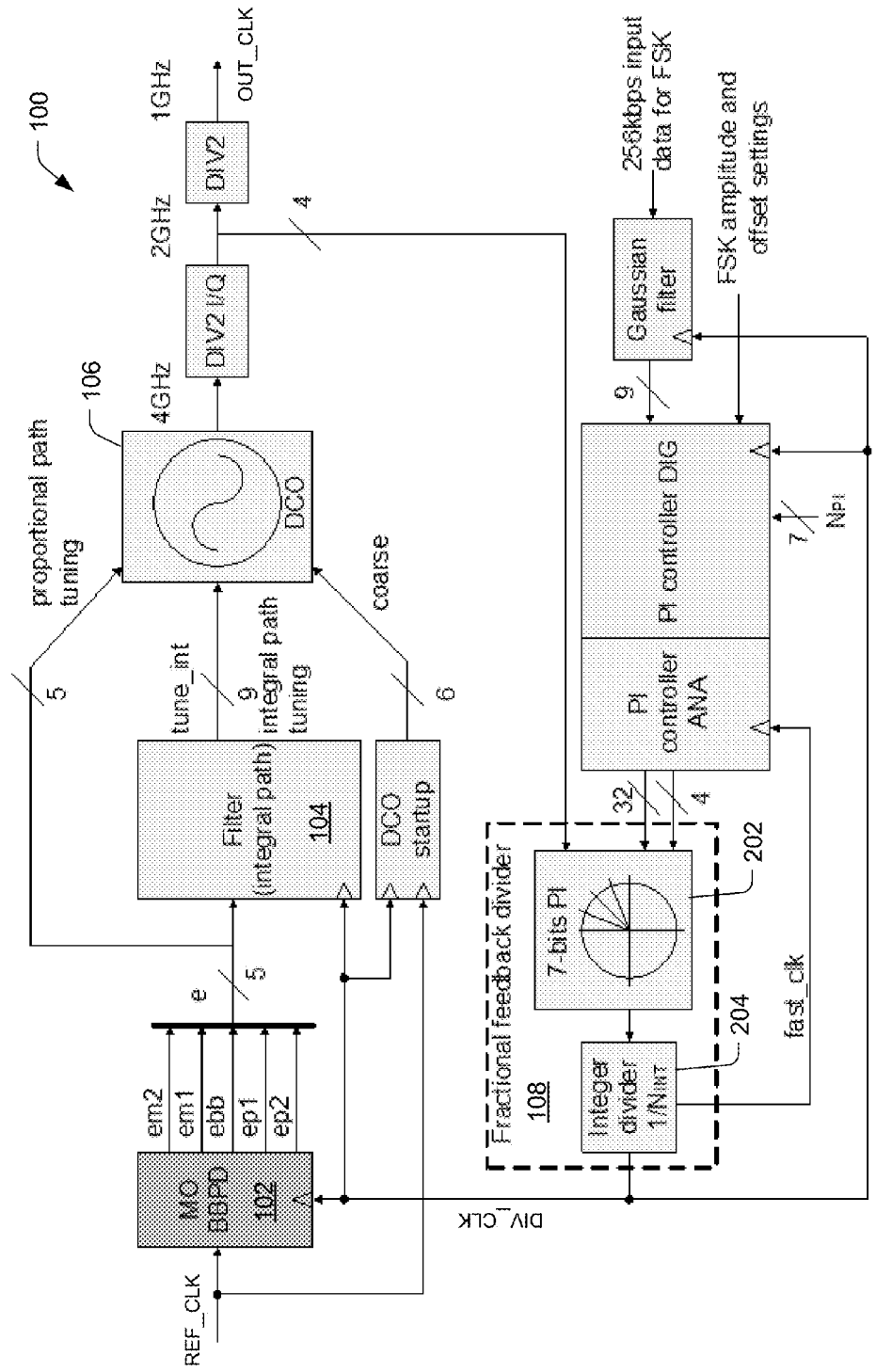
FIG. 2 is a schematic diagram of one example PLL circuit execution.

FIG. 2 is a schematic diagram of one example PLL circuit 100 execution. The PLL 100 illustrates an example PLL with a CO 106 (a digitally controlled oscillator (DCO) in this example), bang-bang phase detector (BBPD) 102, digital filter 104, and frequency divider 108. In the example PLL 100 of FIG. 2, the frequency divider 100 comprises a fractional frequency divider, allowing the CO 106 to generate output signals that are fractional multiples of the reference clock ref_clk.

The design of the PLL 100 of FIG. 2 is not intended to be limiting, and an example PLL 100 may include alternate or additional components, including some shown in FIG. 2. Further, the frequency notations and bit quantity indications of FIG. 2 are examples for ease of discussion. The techniques and devices discussed may be applied to PLLs and other oscillator circuits operating at other frequencies and having other resolutions and bus structures.

In the example illustrated in FIG. 2, the digital PLL 100 includes a 1-bit quantizer (the BBPD 102). Further, the fractional feedback divider 108 includes a phase interpolator (PI) 202, operating as a digital-to-time Converter (DTC). For example, the PI 202 and the divider 204 comprise the fractional feedback divider 108, generating an output to cause the oscillator to generate a signal having a frequency comprising a fractional multiple of a frequency of the reference signal. The usage of the PI 202 in the feedback divider 108 allows exact fractional division (in the resolution of the PI 202) making possible for a bang-bang based digital PLL 100 to implement fractional operation.

The PI 202 receives phased signals from the CO 106, and generates therefrom an adjustable output clock signal div_clk. The adjustable output clock signal div_clk has a phase offset with respect to the out_clk that may be fine-adjusted in the range of 0 to 360° (degrees), for instance. In various implementations, the number of available phase positions of the PI 202 is set at $2^{N_{PI}}$, with $N_{PI}$ being the number of control bits in the PI 202 (e.g., 7 in the example of FIG. 2). In various examples, the PI 202 rotates among the multiple phase positions, providing a predetermined offset to the received CO 106 signal. The offset signal is divided by the divider 204, forming the modified clock signal div_clk.

The described PLL 100 architecture has many advantages compared to some traditional time-to-digital converter (TDC) based architectures. The advantages include much lower complexity and less silicon area occupation as well as outstanding jitter performance with lower power consumption. In various examples, this architecture has the potential to operate in fractional mode with the same jitter and phase noise performance reached in integer mode.

In an example, the limiting factor to a jitter performance target may be the non-linearity of the PI 202, which can introduce spurs in the output spectrum of the PLL 100. In various examples, the spurs can pose limits in the jitter performance and in the usage of this PLL 100 architecture in higher accuracy applications, such as within wireless systems.

Figure 3:
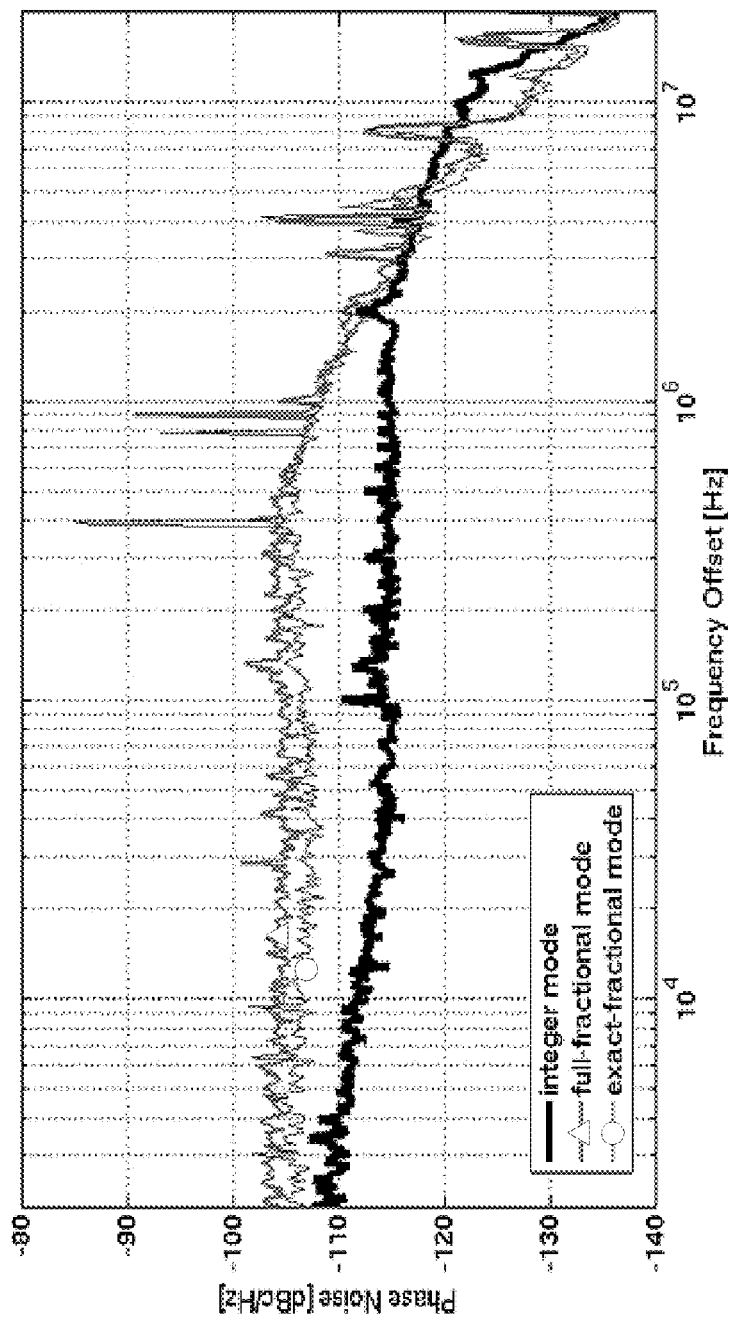
FIG. 3 is a graphical representation of phase noise behavior resulting from phase interpolator (PI) non-linearity, according to an example.

For instance, example output spectra in integer mode and in fractional modes are depicted in the graphic of FIG. 3. The graphic shows example measured phase-noise profiles with an example reference frequency of 25 MHz. Three cases are shown: integer mode (output frequency 1 GHz), exact-fractional mode (output frequency 1.004101 GHz) and full-fractional mode (output frequency 1.004016 GHz). The increased in-band PLL 100 noise and the presence of spurs in the fractional modes compared to the integer-N operation are due to the PI 202 non-linearity. The rotation of phase positions of the PI 202 is the difference between fractional and integer operation in this PLL 100 architecture.

Figure 4:
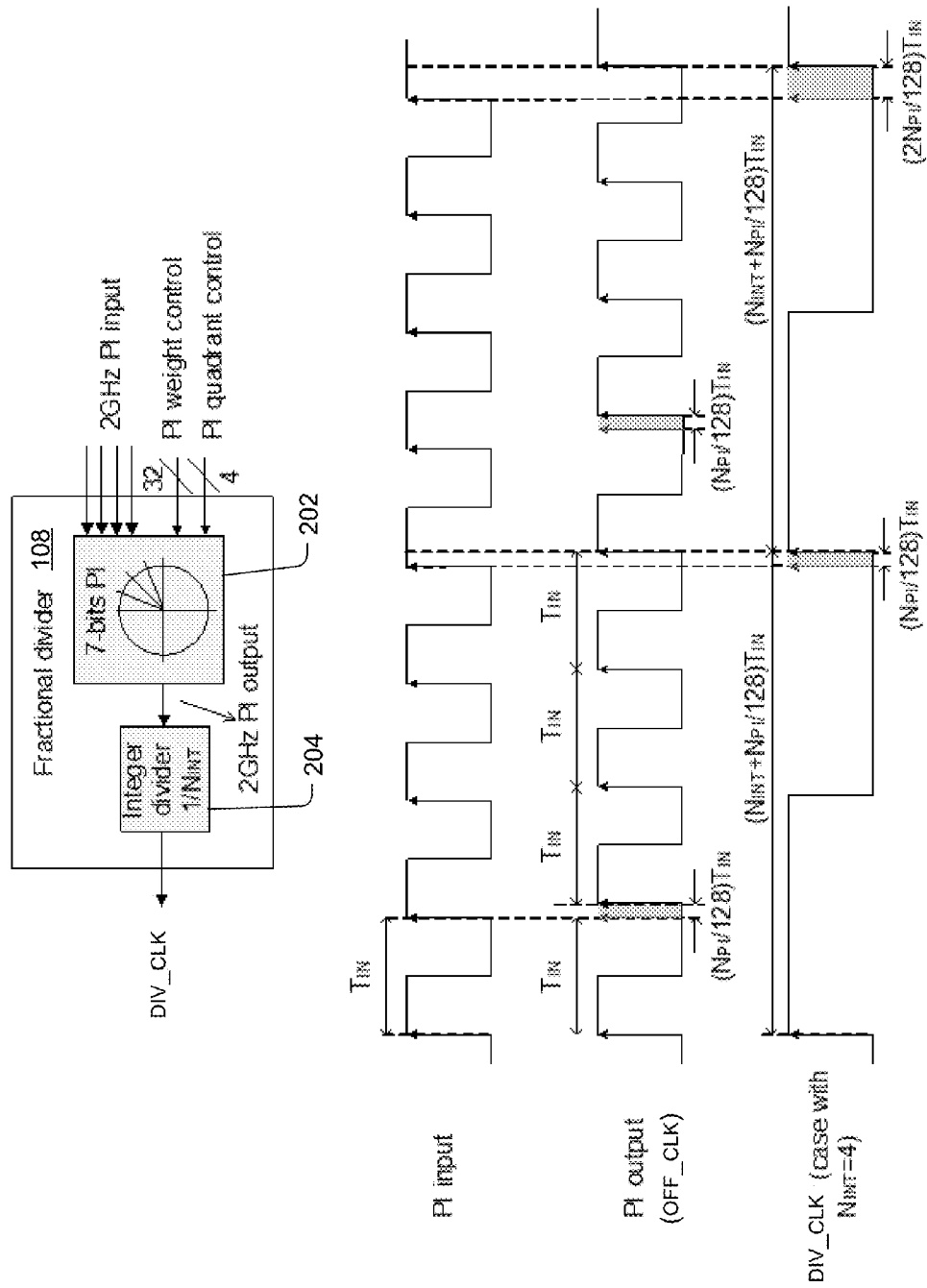
FIG. 4 is a signal diagram showing example operation of a PI-based feedback divider, according to an implementation.

The operation of the exact fractional frequency divider 108 is depicted in FIG. 4. Four periods of the PI 202 output signal are used to generate one period of the div_clk signal. During the div_clk period, the phase setting of the PI 202 is changed so that a precise phase shift is introduced, quantified in number $N_{PI}$ of minimum phase shifts (or PI 202 LSBs). This results in a div_clk period that lasts exactly Tin*(Nint+$N_{PI}$/128). (The example of FIG. 4 is illustrated with Ni=4, $N_{PI}$=1, i.e., Nf=Ni+$N_{PI}$/128=4.0078125.) By repeating the same phase shift at each div_clk output period, the frequency of the div_clk is a constant and the implemented division ratio is fractional: Tdiv/Tin=Nfrac=Nint+$N_{PI}$/128.

The non-linearity of the PI 202 affects the described operation in the sense that the phase shift (e.g., phase position rotation of the PI 202) operated at each div_clk output period is in reality not a constant, but affected by systematic error. Such error repeats periodically as long as the PI 202 rotation pattern is periodic, creating tones on the output spectrum (as shown in FIG. 3).

Example Detecting and Mitigation of Non-Linearity of the PI

Figure 5:
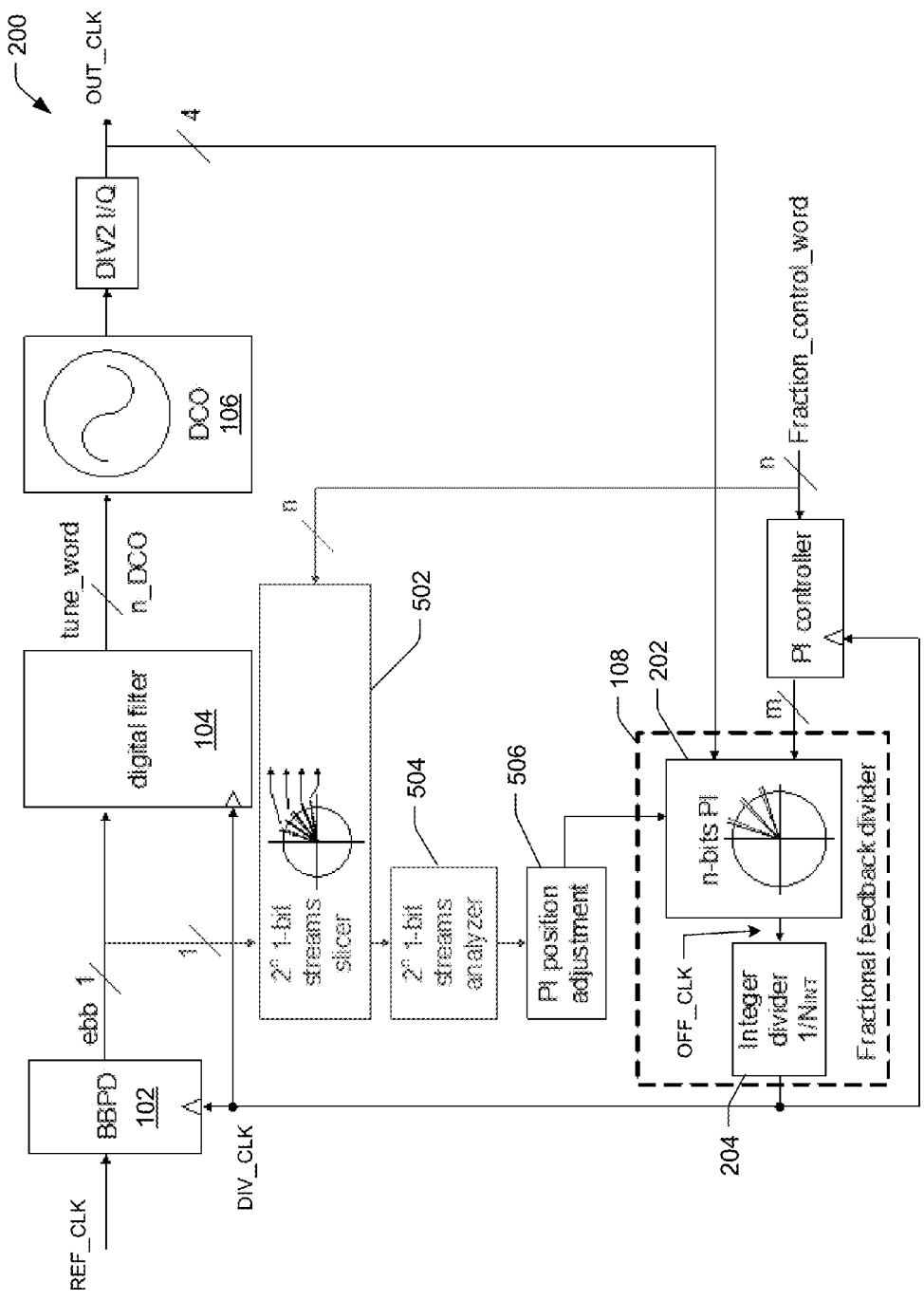
FIG. 5 is a schematic diagram of a PLL circuit including example PI non-linearity detection and mitigation modules, according to an implementation.

FIG. 5 is a schematic diagram of a PLL circuit (or other oscillator circuit) 200. The PLL 200 is a modification of the example PLL 100, in that it also includes example PI non-linearity detection and mitigation modules (i.e., 502, 504, and 506), according to various implementations. In the implementations, the non-linearity of the PI 202 is addressed by detecting the systematic error affecting each PI 202 step phase position and mitigating it. In an implementation, the PI 202 non-linearity may be detected while the PLL 200 is operating in closed loop steady-state, and the non-linearity may be automatically corrected (reduced or removed, for example) during operation (e.g., in the background).

In an implementation, as shown in FIG. 5, the PLL 200 includes a slicing component 502 to segment the 1-bit output stream of the phase detector 102 according to each of multiple phase positions of the PI 202. In an example, the slicing component 502 forms a 1-bit stream for each of the multiple phase positions of the PI 202 due to the segmenting. In the implementation, the PLL 200 also includes an analysis component 504 to detect a PI phase position error based on a content of the 1-bit stream of the respective PI phase position. For example, the analysis component 504 analyzes the content of each of the 1-bit streams of each of the phase positions of the PI 202. In the implementation, the PLL 200 also includes a PI position adjustment component 506 to adjust the respective PI phase position from an actual PI phase position to an improved PI phase position, based on the PI phase position error detected. An improved PI phase position represents a desired phase position, or a phase position that is closer to an ideal phase position than the actual PI phase position.

Example non-linearity detection and mitigation within the PLL 200, based on operation of the slicing component 502, the analysis component 504, and the adjustment component 506, may be explained with reference to FIGS. 5 and 6. In an implementation, a PLL 200 includes a CO (DCO) 106 to output a phased signal (e.g., out_clk), based on receiving a control signal (e.g., tune_word), and a PI 202 to receive the phased signal and to generate an output clock signal (e.g., off_clk) having a phase offset with reference to the phased signal, according to one of multiple phase positions of the PI 202. In an example, the PI 202 is arranged to generate the output clock signal (e.g., off_clk) with the phase offset by rotating through multiple phase positions of the PI 202, with a phase position rotation occurring at each period of a divided clock signal (e.g., div_clk).

In the implementation, the PLL 200 includes a divider 204 to divide a frequency of the PI output clock signal by an integer factor to form the divided clock signal (e.g., div_clk), and a phase detector 102 to compare the divided clock signal to a reference signal (e.g., ref_clk) and to produce a 1-bit output stream (ebb 1) based on the comparing, for generation of the control signal.

In the implementation, the output (ebb 1) of the bang-bang phase detector 102 is a 1-bit output stream. Each bit of the phase detector 1-bit output stream (ebb 1) is the result of a comparison between the position of a rising edge of the reference clock (ref_clk) and a rising edge of the divided clock (div_clk). In one example, the PI 202 position is increased by 1 at each divided clock cycle (alternately, the PI 202 position may advance at any predefined rate). In the example, each bit of the phase detector output stream (ebb 1) is the result of a comparison between ref_clk edge and div_clk edge, whereas the div_clk edge position is determined by a different (and subsequent) PI 202 position.

In an implementation, the stream slicer 502 segments the 1-bit output stream (ebb 1) of the phase detector 102 according to each of the multiple phase positions of the PI 202, where the segmenting forms a 1-bit stream for each of the multiple phase positions of the PI 202. In other words, as shown in FIG. 6, a set of 1-bit streams (e.g., N=w, N=z, N=y, N=x, etc.), corresponding to the set of multiple phase positions of the PI 202 is formed. Each phase position of the PI 202 may then have an associated 1-bit stream (N=n, Ebb).

Figure 6:
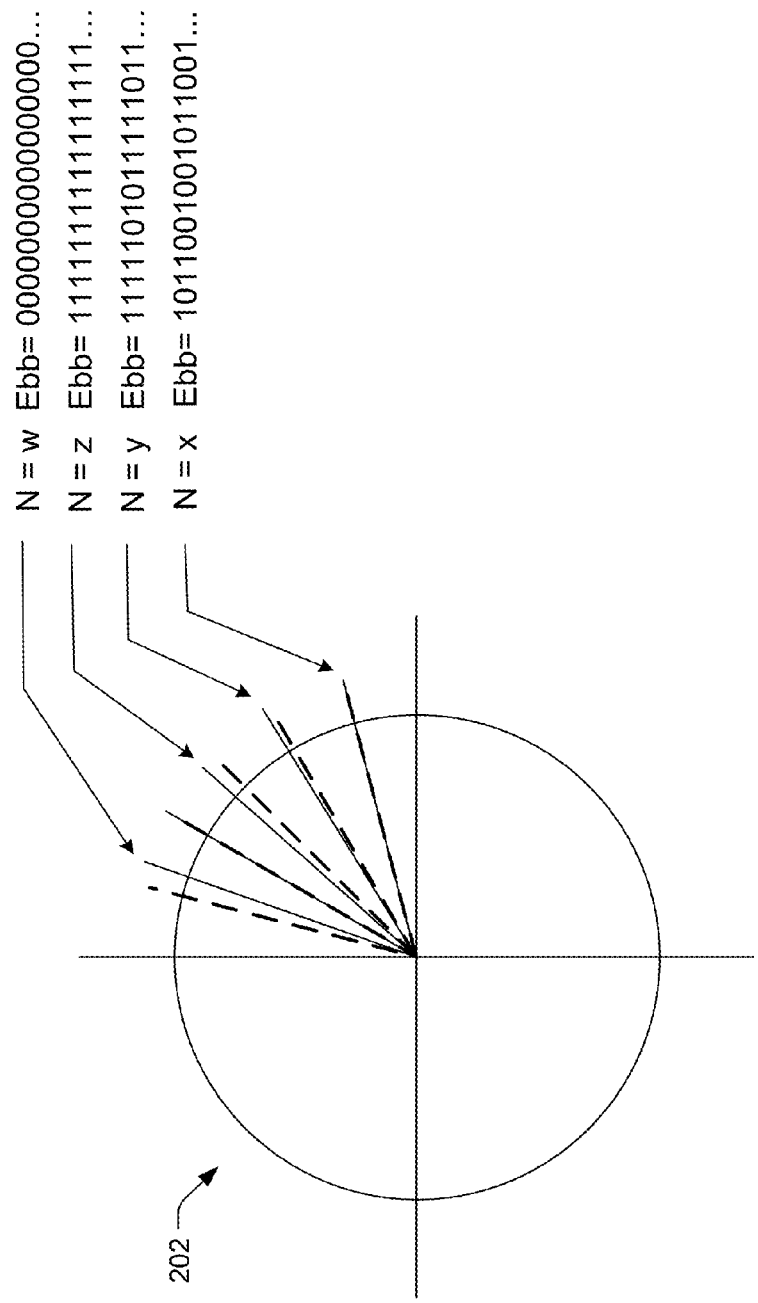
FIG. 6 is a graphical representation of the operation of an example PI non-linearity detection module, according to an implementation.

As shown in FIG. 6, each PI phase position has an ideal value (illustrated with the dashed lines) evenly distributed around the unit interval (UI), and an actual value (illustrated with the solid lines) which may be affected by an error.

If a specific PI phase position has a strong misplacement (see for example position N=z or N=w in FIG. 6), the result of the comparison for that specific PI phase position (more precisely, the PI 202 jump landing on that PI phase position) is a constant, i.e. it is always high or always low (reflected in the constant 1s or 0s, respectively, of the corresponding bit stream). This is because the length of the specific divided period produced by integer division plus the PI phase position rotation given by the jump from the previous position to the actual position is always too big or always too small. Hence, the comparison with the precise reference period will consistently give the same response.

On the other hand, if a PI phase position is perfectly placed (in an ideal position, together with the position before), then the outcome of the specific phase detection will be dominated by noise, i.e. it will appear as a random bit stream (see for example position N=x in FIG. 6). Between the two extremes (a constant output due to deterministic misplacement and a random output due to perfect placement), there are cases in which the pattern is dominated by the deterministic misplacement but still the noise can occasionally invert the detection decision (see for example position N=y in FIG. 6).

In an implementation, the analysis component 504 detects a PI phase position error at a PI phase position, based on evaluating the content of the formed 1-bit stream of the respective PI phase position. In one example, the analysis component 504 detects the PI phase position error by comparing a quantity of accumulated 1 bits to a quantity of accumulated 0 bits within the 1-bit stream of the respective PI phase position. In the example, a ratio of the quantity of accumulated 1 bits to the quantity of accumulated 0 bits within the 1-bit stream of the respective PI phase position can be interpreted to indicate a magnitude of the PI phase position error at the respective PI phase position, and indicates whether the phase position error is leading or lagging the ideal position value.

For example, as shown in FIG. 6, a higher proportion of 1 bits to 0 bits within the 1-bit stream of the respective PI phase position can be an indicator of a leading PI phase position error. Additionally, a higher proportion of 0 bits to 1 bits within the 1-bit stream of the respective PI phase position can be an indicator of a lagging PI phase position error. Further, an equal proportion of 0 bits to 1 bits within the 1-bit stream of the respective PI phase position can be an indicator of an ideal PI phase position.

Accordingly, the information gained from comparing the proportion of 1 bits to 0 bits within the bit streams can be used to mitigate the error. For example, the deviation from a random pattern can be a measure of how strong of non-linearity is associated to the specific PI position, and can therefore be corrected on the fly. Iterating the analysis and the correction continuously for each PI phase position, the system can set each PI phase position around its ideal value.

What is observed in the specific 1-bit streams of the respective phase positions may be interpreted as the impact of the amount of the PI 202 jump between one position and the next (e.g., rotation) and not necessarily the absolute position of the PI 202. This is because the jump is the contributor to the total divided period. On the other hand, what is to be corrected is the absolute position of the PI 202 jumps. In case the absolute position of two consequent PI 202 settings is equally offset, the jump produced by changing to one setting to the other does not show an error. Nevertheless, in such situations, during the calibration process, the starting point of the specific jump can undergo a correction due to the error detection on the previous jumps.

To simplify the correction approach, it can be assumed that the starting point is already ideally placed and the error measured by the 1-bit is due to the landing PI step. An algorithm for phase position correction can be formed based on this assumption, for example, since the starting PI 202 phase (phase zero) is considered ideally placed (it is the reference phase that needs no correction), and the correction of all the other phases is implemented in a sequence, which repeats several times along the UI, and makes the starting PI 202 steps more accurate than the landing PI 202 steps.

Once the PI nonlinearity is detected and measured, according to the techniques and components described above, PI linearization techniques can be applied. For example, in an implementation, the PI position adjustment component 506 can adjust the respective PI phase position from an actual PI phase position to an ideal PI phase position, based on the PI phase position error detected.

In various implementations, the techniques and components for automatic PI 200 linearization can be operated in the background during PLL 200 steady-state operation. Alternately, the PI 200 linearization can be performed during a training period at PLL 200 startup where the PI 202 gets linearized and the linearization coefficient is stored so that the linearization machine (e.g., one or more of the PI non-linearity detection and mitigation modules 502, 504, and 506) can be turned off. In either case, or in other scenarios, the PI 202 non-linearity is measured on chip, during operation or during a dedicated training period.

Example Detection Techniques

In an implementation, integration of the 1-bit stream over time can be used to detect deviation of a 1-bit pattern from a random one (of a 1-bit stream associated to a PI 202 phase position). For example, FIG. 7 includes graphical representations of example PI non-linearity detection results, in a test environment using integration, according to some implementations.

Figure 7:
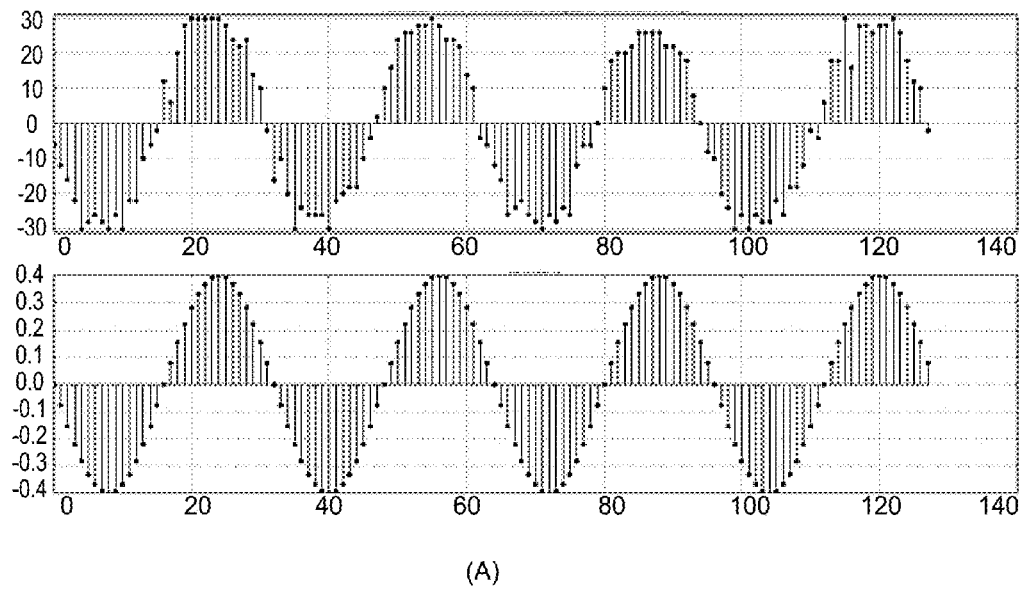
FIG. 7 includes graphical representations of example PI non-linearity detection results, according to some implementations.
Figure 7:
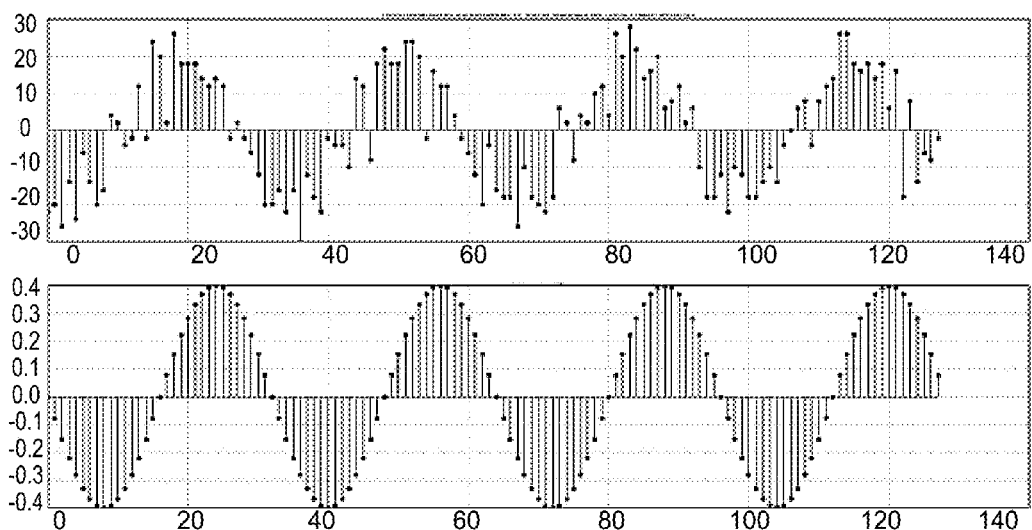

The graphs of FIG. 7 at (A) and (B) show the representative results of two examples. In the examples of FIG. 7, the top plots at (A) and (B) show the PI 202 non-linearity as detected by cumulating 30 consecutive bang-bang output bits for each PI 202 setting separately. The accumulated value is integer 1 for a high value and integer −1 for a low value. On the bottom plots at (A) and (B), the dynamic non-linearity (DNL) of the PI 202, as introduced onto the model and along the PI steps is represented. The plots at (A) represent a PLL 200 having a slower PLL loop and the plots at (B) represent a PLL 200 having a faster PLL loop.

In the examples of FIG. 7, the PI 202 non-linearity observation is done while the PLL 200 is in closed loop and by stepping the PI 202 one step at a time. This means that the dynamic of the PLL 200 plays a role on the effectiveness of the non-linearity observation. The PI 202 non-linearity introduces a period modulation, as shown in the graphs. If the PLL 200 loop is of very high bandwidth, as shown in the graph set at (B), the loop is able to track this modulation more efficiently than if the loop is low bandwidth, as shown in the graph set at (A).

This means, the nonlinearity can be "hidden" by the fast loop, and the segmented phase detector 102 stream will approach more random-like pattern for larger non-linearities than it would do with a slow loop. It may be therefore beneficial to program the digital loop parameters to have a slow loop during a training sequence, to have more gain on the transfer function between physical non-linearity and average of the segmented bit stream. This effect is shown in FIG. 7 at (A) and (B), where the same behavioral model of the PLL 200 is used, but the bandwidth of the PLL 200 is programmed to be faster at (B) than at (A). The accumulated values with faster bandwidth at (B) do not show the non-linearity as clearly as the case with low bandwidth at (A).

In alternate implementations, the PLL 200 (or oscillator circuit) may include fewer, additional, or alternate components and remain within the scope of the disclosure. Further, the techniques, components, and devices described herein with respect to the implementations are not limited to the illustrations in FIGS. 1-7, and may be applied to other oscillator circuits or PLLs, including various devices and designs, without departing from the scope of the disclosure. In some cases, additional or alternative components may be used to implement the techniques described herein. Further, the components may be arranged and/or combined in various combinations. It is to be understood that a PLL 200 (or oscillator circuit) may be implemented as a stand-alone device or as part of another system (e.g., integrated with other components, systems, etc.).

Representative Process

Figure 8:
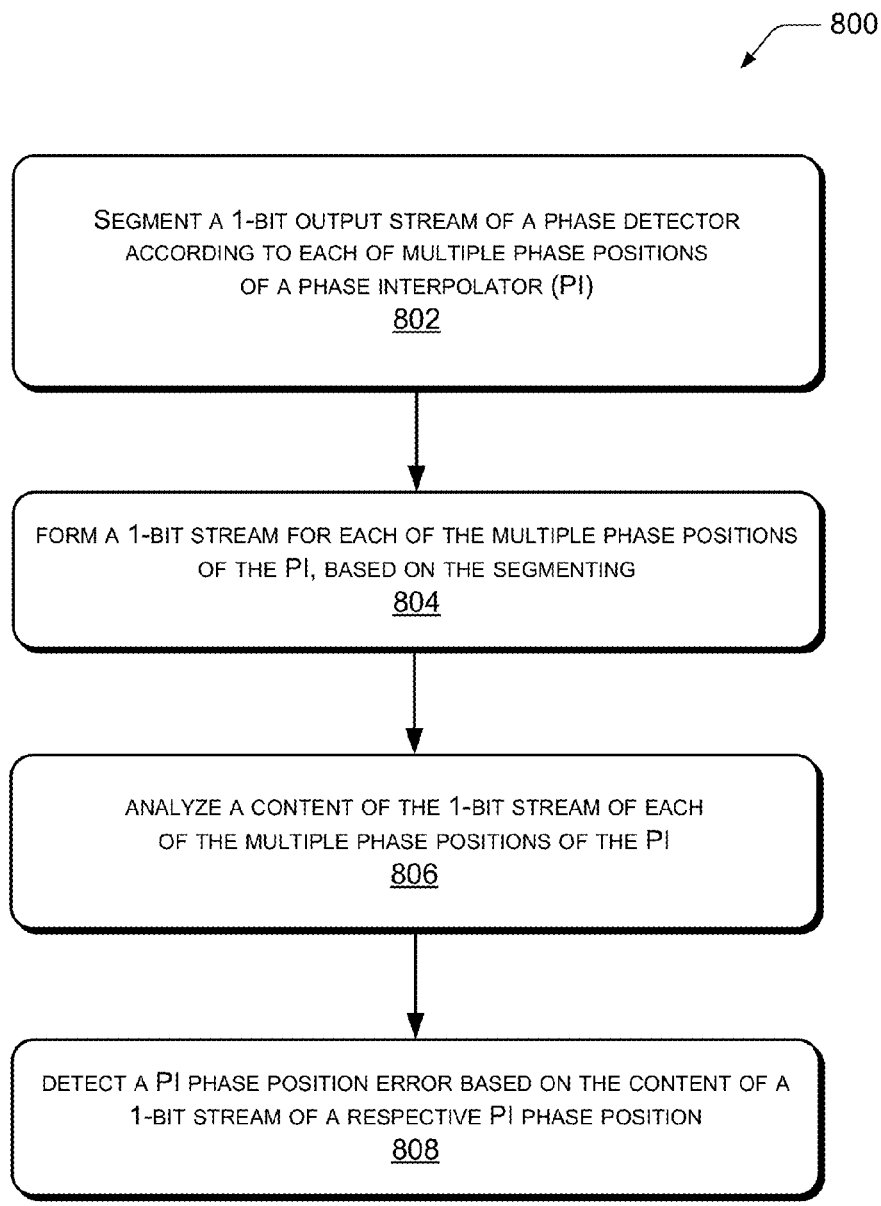
FIG. 8 is a flow diagram illustrating an example process for detecting and mitigating PI non-linearity, according to an implementation.

FIG. 8 is a flow diagram illustrating an example process 800 for reducing the non-linearity of a phase interpolator (PI) (such as PI 202, for example) of an oscillator circuit (such as PLL 100 or 200, for example), and thereby reducing jitter and phase noise of the oscillator circuit. In an implementation, the PI is part of a fractional feedback divider (such as feedback divider 108, for example) that allows the oscillator circuit to generate signals having frequencies that are fractional multiples of the reference frequency. The process 800 is described with reference to FIGS. 1-7.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 802, the process includes segmenting a 1-bit output stream of a phase detector (such as phase detector 102, for example) according to each of multiple phase positions of the phase interpolator (PI). At block 804, the process includes forming a 1-bit stream for each of the multiple phase positions of the PI, based on the segmenting.

At block 806, the process includes analyzing a content of the 1-bit stream of each of the multiple phase positions of the PI. In an implementation the process includes accumulating different bit values detected in the 1-bit stream of each of the multiple phase positions of the PI.

At block 808, the process includes detecting a PI phase position error based on the content of a 1-bit stream of a respective PI phase position. In an example, the process includes detecting the PI phase position error based on a proportion of accumulated first bit values to accumulated second bit values within the 1-bit stream of the respective PI phase position. In another example, the process includes determining a magnitude of the PI phase position error based on the proportion of first bit values (1s for example) to second bit values (0s for example) within the 1-bit stream of the respective PI phase position.

In an implementation, the process includes detecting a PI phase position error at a PI phase position based on determining a randomness of the content of the 1-bit stream of the respective PI phase position, wherein a greater deviation from a random pattern is an indication of a greater magnitude of the PI phase position error. In one example, the process includes detecting a PI phase position error at a PI phase position based on integrating the content of the 1-bit stream of the respective PI phase position over time.

In an implementation, a current PI phase position is based on a rotation among the multiple phase positions of the PI, the rotation comprising a jump from one phase position to an adjacent phase position with each cycle of a divided oscillator output clock, each of the multiple phase positions having a phase offset with reference to the oscillator output clock. In the implementation, the process includes assuming a starting point of a rotation jump is ideally placed, and measuring a phase position error based on a landing point of the rotation jump.

In an implementation, the process includes adjusting the respective PI phase position from an actual PI phase position to an improved (i.e., closer to ideal) PI phase position, based on the PI phase position error detected.

In an example, the process includes determining a non-linearity of the PI based on analyzing the content of the 1-bit stream of each of the multiple phase positions of the PI and mitigating the non-linearity of the PI based on adjusting the respective PI phase positions having phase errors. In one example, the process includes automatically and continuously adjusting a PI phase position during steady-state operation of the PI within an oscillator circuit.

In another example, the process includes determining a linearization coefficient for mitigating the non-linearity of the PI during a training sequence or during startup of the PI, storing the linearization coefficient, and using the stored linearization coefficient to mitigate the non-linearity of the PI during steady-state operation of the PI, without further error detecting.

In alternate implementations, other techniques may be included in the process 800 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus, comprising:
   a slicing component to segment a 1-bit output stream of a phase detector according to each of multiple phase positions of a phase interpolator (PI), the slicing component forming a 1-bit stream for each of the multiple phase positions of the PI; and
   an analysis component to detect a PI phase position error based on a content of the 1-bit stream of the respective PI phase position.

2. The apparatus of claim 1, further comprising a PI position adjustment component to adjust the respective PI phase position from an actual PI phase position to a corrected PI phase position, based on the PI phase position error detected.

3. The apparatus of claim 1, wherein the analysis component detects the PI phase position error based on a proportion of accumulated first bit values to accumulated second bit values within the 1-bit stream of the respective PI phase position.

4. The apparatus of claim 3, wherein a value of the proportion of accumulated first bit values to accumulated second bit values within the 1-bit stream of the respective PI phase position indicates a magnitude of the PI phase position error.

5. The apparatus of claim 3, wherein a higher proportion of 1 bits to 0 bits within the 1-bit stream of the respective PI phase position is an indicator of a leading PI phase position error.

6. The apparatus of claim 3, wherein a higher proportion of 0 bits to 1 bits within the 1-bit stream of the respective PI phase position is an indicator of a lagging PI phase position error.

7. The apparatus of claim 3, wherein an equal proportion of 0 bits to 1 bits within the 1-bit stream of the respective PI phase position is an indicator of an ideal PI phase position.

8. An oscillator circuit, comprising:
a controlled oscillator to output a phased signal, based on receiving a control signal;
a phase interpolator (PI) to receive the phased signal and to generate an output clock signal having a phase offset with reference to the phased signal, according to one of multiple phase positions of the PI;
a divider to divide a frequency of the output clock signal by an integer factor to form a divided clock signal;
a phase detector to compare the divided clock signal to a reference signal and to produce a 1-bit output stream based on the comparing, for generation of the control signal;
a slicing component to segment the 1-bit output stream of the phase detector according to each of the multiple phase positions of the PI, the slicing component forming a 1-bit stream for each of the multiple phase positions of the PI; and
an analysis component to detect a PI phase position error at a PI phase position, based on a content of the 1-bit stream of the respective PI phase position.

9. The oscillator circuit of claim 8, further comprising a PI position adjustment component to adjust the respective PI phase position from an actual PI phase position to a corrected PI phase position, based on the PI phase position error detected.

10. The oscillator circuit of claim 8, wherein the PI is arranged to generate the output clock signal with the phase offset by rotating through multiple phase positions of the PI, with a phase position rotation occurring at each period of the divided clock signal.

11. The oscillator circuit of claim 8, wherein the PI and the divider comprise a fractional feedback divider, generating an output to cause the oscillator to generate a signal having a frequency comprising a fractional multiple of a frequency of the reference signal.

12. The oscillator circuit of claim 8, wherein the analysis component detects the PI phase position error by comparing a quantity of 1 bits to a quantity of 0 bits within the 1-bit stream of the respective PI phase position.

13. The oscillator circuit of claim 12, wherein a ratio of the quantity of 1 bits to the quantity of 0 bits within the 1-bit stream of the respective PI phase position indicates a magnitude of the PI phase position error at the respective PI phase position.

14. The oscillator circuit of claim 8, wherein each bit of the phase detector 1-bit output stream is the result of a comparison between a clock edge of the reference signal and a clock edge of the divided clock signal.

15. A method, comprising:
segmenting a 1-bit output stream of a phase detector according to each of multiple phase positions of a phase interpolator (PI);
forming a 1-bit stream for each of the multiple phase positions of the PI, based on the segmenting;
analyzing a content of the 1-bit stream of each of the multiple phase positions of the PI; and
detecting a PI phase position error based on the content of a 1-bit stream of a respective PI phase position.

16. The method of claim 15, further comprising adjusting the respective PI phase position from an actual PI phase position to a corrected PI phase position, based on the PI phase position error detected.

17. The method of claim 16, further comprising determining a non-linearity of the PI based on analyzing the content of the 1-bit stream of each of the multiple phase positions of the PI and mitigating the non-linearity of the PI based on adjusting the respective PI phase positions having phase errors.

18. The method of claim 17, further comprising automatically and continuously adjusting a PI phase position during steady-state operation of the PI within an oscillator circuit.

19. The method of claim 17, further comprising determining a linearization coefficient for mitigating the non-linearity of the PI during a training sequence or during startup of the PI, storing the linearization coefficient, and using the stored linearization coefficient to mitigate the non-linearity of the PI during steady-state operation of the PI, without further error detecting.

20. The method of claim 15, further comprising detecting the PI phase position error based on a proportion of first bit values to second bit values within the 1-bit stream of the respective PI phase position.

21. The method of claim 20, further comprising determining a magnitude of the PI phase position error based on the proportion of first bit values to second bit values within the 1-bit stream of the respective PI phase position.

22. The method of claim 15, further comprising detecting a PI phase position error at a PI phase position based on determining a randomness of the content of the 1-bit stream of the respective PI phase position, wherein a greater deviation from a random pattern is an indication of a greater magnitude of the PI phase position error.

23. The method of claim 15, further comprising detecting a PI phase position error at a PI phase position based on integrating the content of the 1-bit stream of the respective PI phase position over time.

24. The method of claim 15, wherein a current PI phase position is based on a rotation among the multiple phase positions of the PI, the rotation comprising a jump from one phase position to an adjacent phase position with each cycle of a divided oscillator output clock, each of the multiple phase positions having a phase offset with reference to the oscillator output clock.

25. The method of claim 24, further comprising assuming a starting point of a rotation jump is ideally placed, and measuring a phase position error based on a landing point of the rotation jump.

* * * * *